United States Patent
Lin et al.

(10) Patent No.: US 7,816,217 B2
(45) Date of Patent: Oct. 19, 2010

(54) MULTI-STEP EPITAXIAL PROCESS FOR DEPOSITING SI/SIGE

(75) Inventors: Li-Te S. Lin, Hsinchu County (TW); Pang-Yen Tsai, Hsinchu Hsian (TW); Chih-Chien Chang, Miow-Li County (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 892 days.

(21) Appl. No.: 11/313,768

(22) Filed: Dec. 22, 2005

(65) Prior Publication Data

US 2007/0148919 A1   Jun. 28, 2007

(51) Int. Cl.
*H01L 21/336* (2006.01)

(52) U.S. Cl. ............... 438/300; 257/346; 257/E21.431; 438/503

(58) Field of Classification Search ................ 438/299, 438/300, 503; 257/346, E21.431
See application file for complete search history.

(56) References Cited

U.S. PATENT DOCUMENTS

| | | | |
|---|---|---|---|
| 6,274,894 B1* | 8/2001 | Wieczorek et al. | 257/192 |
| 7,250,351 B2* | 7/2007 | Furukawa et al. | 438/423 |
| 2003/0005881 A1* | 1/2003 | Shin | 117/97 |
| 2005/0012146 A1* | 1/2005 | Murthy et al. | 257/336 |
| 2005/0252443 A1 | 11/2005 | Tsai et al. | |

OTHER PUBLICATIONS

State Intellectual Property Office of The People's Republic of China, first Office Action, May 9, 2008, three pages.
State Intellectual Property Office of The People's Republic of China, second Office Action, Oct. 24, 2008, three pages.

* cited by examiner

*Primary Examiner*—Steven J Fulk
(74) *Attorney, Agent, or Firm*—Finnegan, Henderson, Farabow, Garrett & Dunner, LLP

(57) ABSTRACT

A method for manufacturing a semiconductor device includes providing a substrate comprising silicon, cleaning the substrate, performing a first low pressure chemical vapor deposition (LPCVD) process using a first source gas to selectively deposit a seeding layer of silicon (Si) over the substrate, performing a second LPCVD process using a second source gas to selectively deposit a first layer of silicon germanium (SiGe) over the layer of Si, the second source gas including hydrochloride at a first flow rate, and performing a third LPCVD process using a third source gas including hydrochloride at a second flow rate. The first flow rate is substantially lower than the second flow rate.

21 Claims, 6 Drawing Sheets

MULTI-STEP EPITAXIAL PROCESS FOR DEPOSITING SI/SIGE

FIELD OF THE INVENTION

This invention relates in general to a method for manufacturing semiconductor devices and, more particularly, to a multi-step epitaxial process for depositing silicon and silicon germanium.

BACKGROUND OF THE INVENTION

Silicon germanium (SiGe) epitaxial layers formed on silicon (Si) wafers have been extensively investigated because they enable the passivation of interfaces and the generation of devices with diverse functions. For example, the heterostructure of SiGe on Si may be used to form a heterojunction bipolar transistor. Another example is an epitaxial layer of SiGe formed on source and drain regions of an MOS transistor for reducing the resistance of the source and drain regions.

Generally, SiGe epitaxial layers are formed with patterns instead of as a blanket on a Si wafer. A selective low pressure chemical vapor deposition (LPCVD) process is often performed to selectively grow SiGe epitaxial layers. FIG. 1 shows a Si wafer 100 having SiGe selectively formed thereon. To form the structure shown in FIG. 1, a Si wafer 100 is first provided. A plurality of patterns 102 are formed on Si wafer 100, exposing portions of Si wafer 100. Patterns 102 may comprise a layer of dielectric or otherwise may be capped with dielectric. Si wafer 100 having patterns 102 formed thereon is cleaned with hydrofluoric acid to remove native oxide on the exposed portions of Si wafer 100 and then sent to a CVD (chemical vapor deposition) machine. After Si wafer 100 is loaded into the CVD machine, another cleaning step is performed by baking Si wafer 100 in a hydrogen ($H_2$) environment. A selective epitaxial growth by LPCVD is then performed to deposit a layer of SiGe 104 on the exposed portions of Si wafer 100. In particular, the LPCVD process uses a source gas including dichlorosilane ($SiH_2Cl_2$, also "DCS"), germane ($GeH_4$), $H_2$, and hydrochloride (HCl), where DCS and $GeH_4$ are the respective source gases for silicon and germanium, $H_2$ is the carrier gas for diluting DCS and $GeH_4$, and HCl acts as an etchant gas. In the source gas, a flow rate of DCS is approximately 40-80 sccms (standard cubic centimeter per minute, a flow rate of $GeH_4$ is approximately 100 sccms to several hundred sccms, a flow rate of HCl is approximately 100 sccms and above, and a flow rate of $H_2$ is on the order of several to tens of slms (standard liters per minute). Because patterns 102 comprise dielectric or are capped with dielectric, SiGe is formed only on the exposed portions of Si wafer 100.

A pattern dependence problem with the above selective LPCVD process refers to a phenomenon that the quality of SiGe layer 104 depends on a dimension of the exposed portions of the Si wafer. In particular, because SiGe and Si have different lattice constants, SiGe formed on a Si substrate is susceptible to the effect of defects on a surface of the Si substrate, especially on small surface areas of the Si substrate. Consequently, the selective LPCVD process may succeed in manufacturing large devices but may fail in manufacturing small devices. For example, using the same selective LPCVD process, the yield of manufacturing devices having a critical dimension of 90 nm may be significantly higher than the yield of manufacturing devices having a critical dimension of 65 nm.

Another problem with the above selective LPCVD process is sometimes referred to as the mushroom problem and may be described with reference to FIG. 2, which shows a specific example of the structure of FIG. 1. As shown in FIG. 2, one of patterns 102, labeled as 102-1, comprises a gate structure of an MOS transistor 10, where MOS transistor 10 also includes two diffusion regions 106 and 108 formed in Si wafer 100 as source and drain regions. Pattern 102-1 comprises a layer of gate dielectric 110, a gate electrode 112 comprising polysilicon, a cap layer 114 comprising an oxide or nitride, and two spacers 116 on sidewalls of gate electrode 112 and gate dielectric 110. SiGe layers 104 are deposited by the selective LPCVD process on diffusion regions 106 and 108 to thicken the source and drain regions of MOS transistor 10, thereby reducing a resistance of the source and drain regions. Diffusion regions 106 and 108 may also be recess etched, as shown in FIG. 2, so that SiGe layers 104 are partly formed on the sides of a channel region between diffusion regions 106 and 108 for improved carrier mobility in the channel. It is generally desirable that cap layer 114 cover the entire surface of gate electrode 112 such that no SiGe is formed on gate electrode 112. However, it is possible or sometimes necessary that a part (as shown in FIG. 2) or a whole (not shown) of gate electrode 112 is exposed when the selective LPCVD process is performed. As a result, polycrystalline SiGe forms on the exposed portion of gate electrode 112. Although HCl used in the LPCVD process etches polycrystalline SiGe as it grows, the etching rate of polycrystalline SiGe depends on a flow rate of HCl. If the flow rate of HCl is not sufficiently high, a residue 104' of the polycrystalline SiGe remains on the exposed portion of gate electrode 112. Because the polycrystalline SiGe also expands laterally, polycrystalline residue 104' is often in the shape of a mushroom.

The mushroom problem may be suppressed by increasing the flow rate of HCl so that polycrystalline SiGe is etched at a faster speed. However, because HCl also etches crystalline SiGe, as the flow rate of HCl increases, a growth rate of SiGe decreases and a quality of crystalline SiGe formed on the source and drain regions of MOS transistor 10 is degraded.

SUMMARY OF THE INVENTION

A method for manufacturing a semiconductor device consistent with embodiments of the present invention includes providing a substrate comprising silicon, cleaning the substrate, selectively depositing a seeding layer of silicon over the substrate, and selectively depositing a layer of silicon germanium over the seeding layer of silicon.

A method for manufacturing a semiconductor device consistent with embodiments of the present invention includes providing a substrate comprising silicon, cleaning the substrate, performing a first low pressure chemical vapor deposition (LPCVD) process using a first source gas to selectively deposit a seeding layer of silicon (Si) over the substrate, performing a second LPCVD process using a second source gas to selectively deposit a first layer of silicon germanium (SiGe) over the layer of Si, the second source gas including hydrochloride at a first flow rate, and performing a third LPCVD process using a third source gas including hydrochloride at a second flow rate. The first flow rate is substantially lower than the second flow rate.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
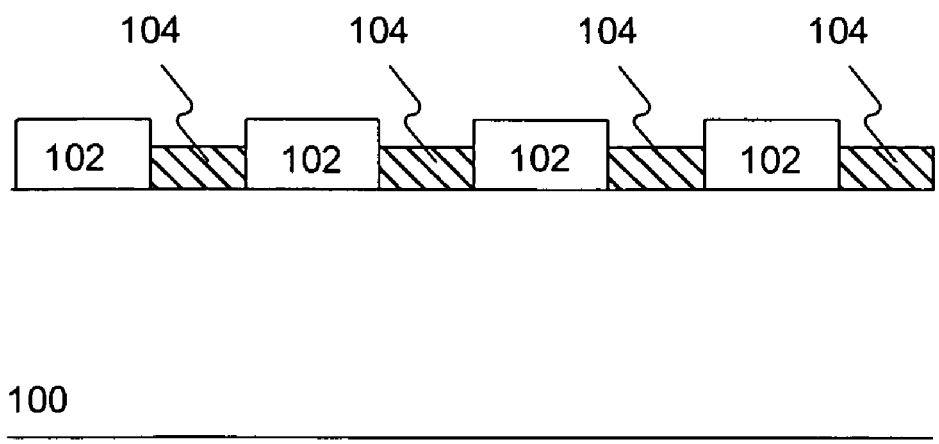
FIG. 1 shows a silicon wafer having silicon germanium selectively formed thereon according to a conventional method.
Figure 2:
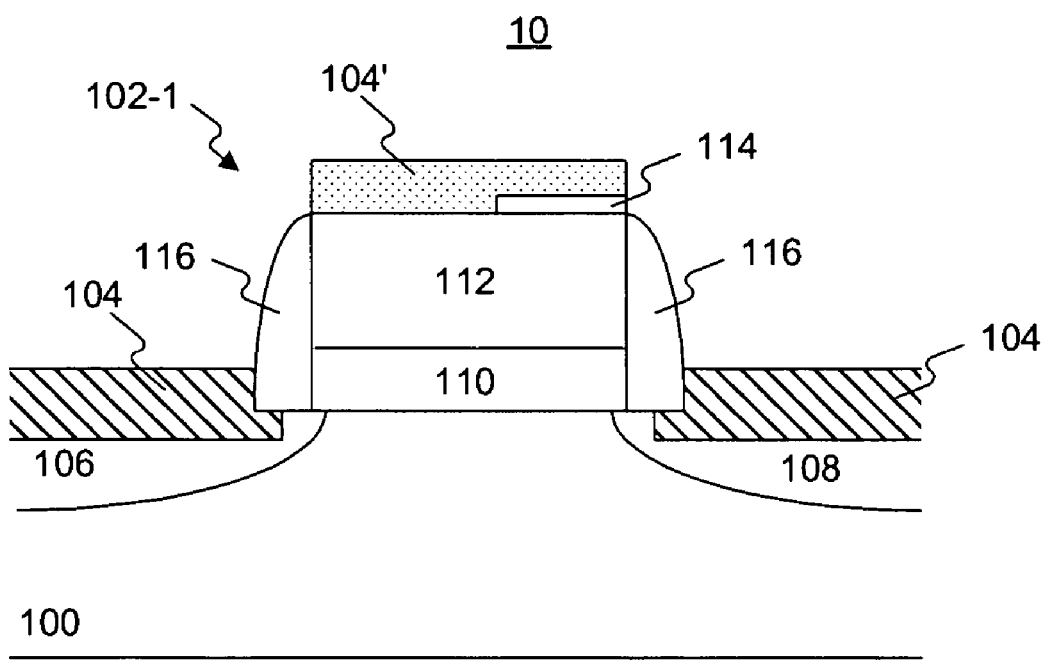
FIG. 2 shows a specific example of the structure of FIG. 1 for illustrating a mushroom problem.
Figure 3A:
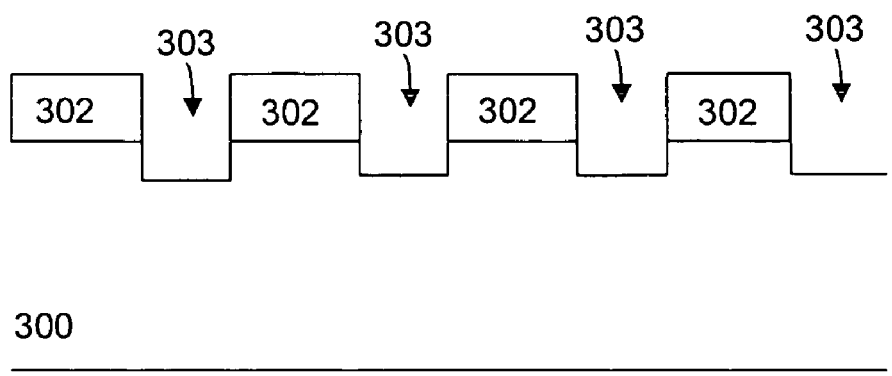
FIGS. 3A-3C illustrate a method consistent with a first embodiment of the present invention.
Figure 3B:
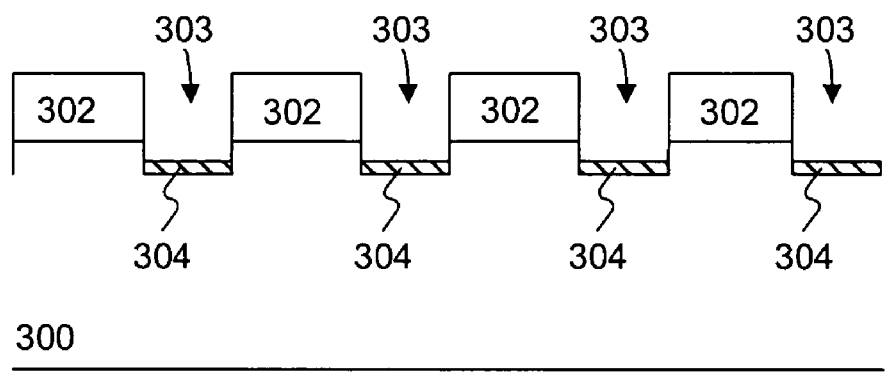
Figure 3C:
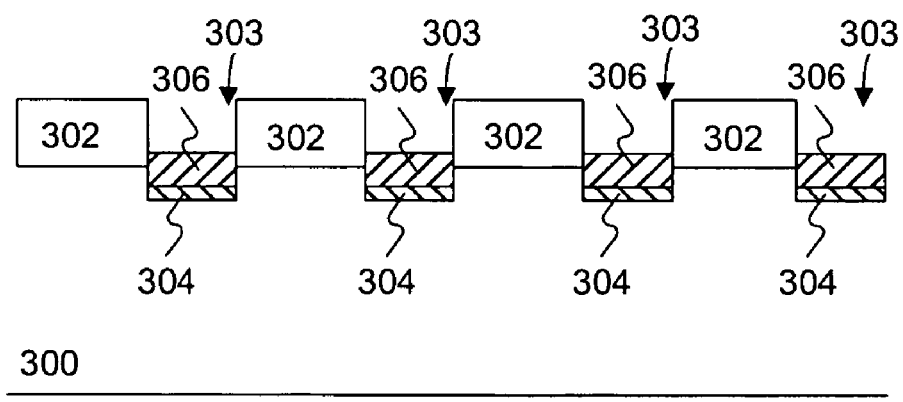

Consistent with a first embodiment of the present invention, there is provided a novel method for forming an epitaxial SiGe layer that avoids the problem of pattern dependence in conventional methods. FIGS. 3A-3C illustrate the method consistent with the first embodiment of the present invention.

In FIG. 3A, a Si substrate 300 is provided. A plurality of features 302 are formed on Si substrate 300. Si substrate 300 is also recess etched by, e.g., a wet etching process, to form a plurality of recesses 303 between features 302. The recess etch may be performed using features 302 or a photoresist pattern as a mask. Features 302 may comprise a layer of dielectric such as oxide or nitride or any suitable pattern capped with a layer of dielectric such as oxide or nitride. In one aspect, a plurality of MOS transistors (not shown) are formed on Si substrate 300 and features 302 comprise gate structures of the MOS transistors. Si substrate 300 is then cleaned, e.g., with hydrofluoric acid, to remove native oxide on exposed portions of Si substrate 300.

In FIG. 3B, Si substrate 300 having features 302 formed thereon and recesses 303 formed therein is sent to a CVD machine (not shown) and another cleaning step is performed by baking Si substrate 300 in an $H_2$ environment, in which a flow rate of $H_2$ is on the order of tens of sccms, and a temperature is between 600° C. and 1100° C. A first selective LPCVD process is then performed, using a first source gas including DCS diluted in $H_2$, to form a layer of Si 304 on portions of Si substrate 300 exposed in recesses 303. In one aspect, in the first source gas, a flow rate of DCS is approximately 50-200 sccms and a flow rate of $H_2$ is on the order of several to tens of slms. Because features 302 comprise dielectric or are capped with dielectric, no Si is formed on features 302. In one aspect, Si layer 304 has a thickness of about 10-70 Å.

In FIG. 3C, a second selective LPCVD process is performed, using a second source gas including DCS, $GeH_4$, and HCl diluted in $H_2$, to form a layer of SiGe 306 on Si layer 304. In one aspect, in the second source gas, a flow rate of DCS is approximately 40-100 sccms, a flow rate of $GeH_4$ is approximately 80-200 sccms, a flow rate of HCl is approximately 20-60 sccms, and a flow rate of $H_2$ is on the order of several to tens of slms. Impurity gases may also be included in the second source gas to dope SiGe layer 306. For example, if SiGe layer 306 is to be formed as p-type, $B_2H_6$ may be included in the second source gas.

In the processing methods illustrated in FIGS. 3A-3C, Si layer 304 formed on the portions of Si substrate 300 exposed in recesses 303 acts as a seeding layer for later formed SiGe layer 306. Because Si layer 304 and Si substrate 300 comprise the same material, the growth of Si layer 304 on Si substrate 300 is less affected by defects on a surface of Si substrate 300 than would be a growth of a layer of SiGe on Si substrate 300. Also, the cleaning by baking in $H_2$ and the first and second selective LPCVD processes are all performed in situ, i.e., they are performed in the same machinery without unloading Si substrate 300. Therefore, a surface of Si layer 304 is virtually free of defects, and SiGe layer 306 subsequently formed on Si layer 304 can have a higher quality than a layer of SiGe directly formed on Si substrate 300. As a result, the pattern dependence problem associated with conventional processing methods is avoided.

Consistent with a second embodiment of the present invention, there is provided a novel method for forming an epitaxial SiGe layer that obviates both the problem of pattern dependence and the mushroom problem. FIGS. 4A-4D illustrate the method consistent with the second embodiment of the present invention.

Figure 4A:
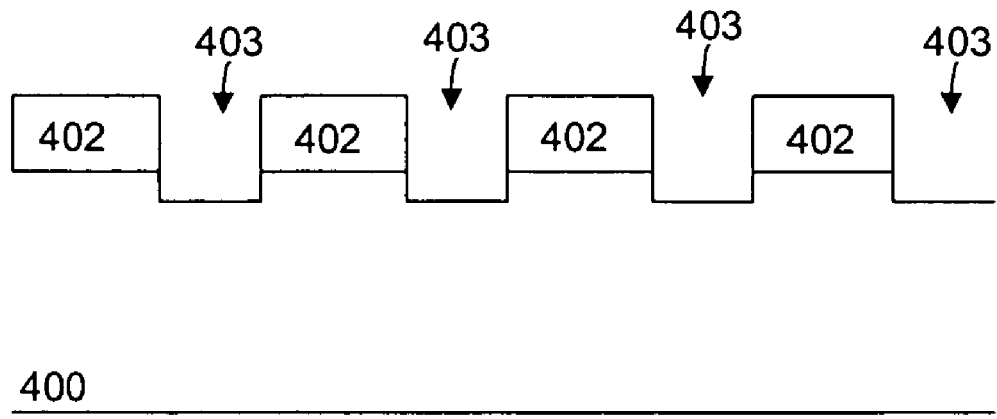
FIGS. 4A-4D illustrate a method consistent with a second embodiment of the present invention.

In FIG. 4A, a Si substrate 400 is provided. A plurality of features 402 are formed on Si substrate 400. Si substrate 400 is also recess etched by, e.g., a wet etching process, to form a plurality of recesses 403 between features 402. The recess etch may be performed using features 402 or a photoresist pattern as a mask. Features 402 may comprise a layer of dielectric such as oxide or nitride or any suitable pattern capped with a layer of dielectric such as oxide or nitride. Native oxide on the exposed portions of Si substrate 400 may be removed using hydrofluoric acid.

Figure 4B:
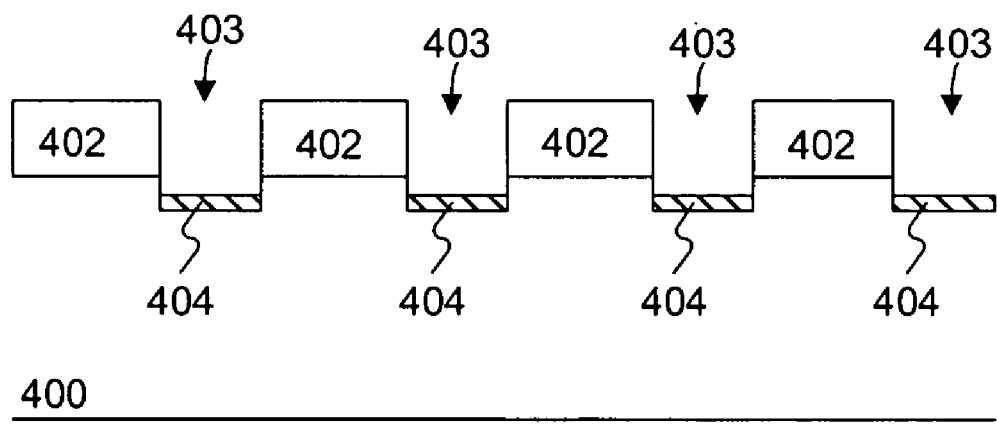

In FIG. 4B, Si substrate 400 is sent to a CVD machine (not shown) and another cleaning step is performed by baking Si substrate 400 in an $H_2$ environment, in which a flow rate of $H_2$ is on the order of tens of sccms, and a temperature is between 600° C. and 1100° C. Next, a first selective LPCVD process is performed, using a first source gas including DCS diluted in $H_2$, to form a Si layer 404 on portions of Si substrate 400 exposed in recesses 403. In one aspect, in the first source gas, a flow rate of DCS is approximately 50-200 sccms and a flow rate of $H_2$ is on the order of several to tens of slms. In another aspect, Si layer 404 has a thickness of about 10-70 Å.

Figure 4C:
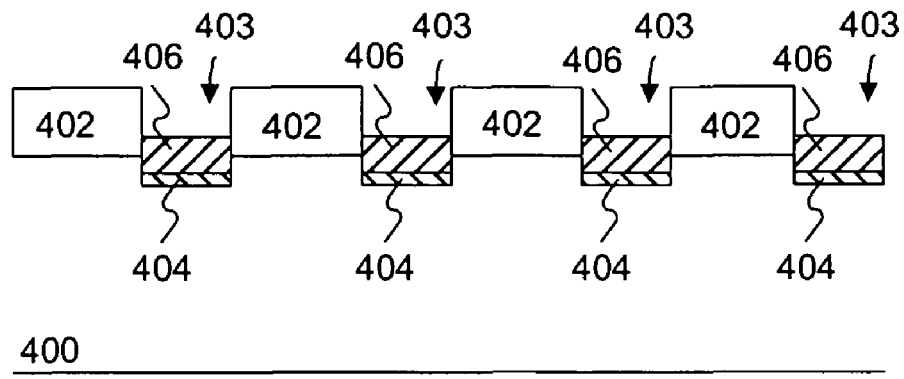

In FIG. 4C, a second selective LPCVD process is performed, using a second source gas including DCS, $GeH_4$, and HCl diluted in $H_2$, to form a first SiGe layer 406 on Si layer 404. In one aspect, in the second source gas, a flow rate of DCS is approximately 40-100 sccms, a flow rate of $GeH_4$ is approximately 80-200 sccms, a flow rate of HCl is approximately 20-60 sccms, and a flow rate of $H_2$ is on the order of several to tens of slms. Impurity gases may be included in the second source gas to dope first SiGe layer 406. For example, if SiGe layer 406 is to be formed as p-type, $B_2H_6$ may be included in the second source gas.

Because the flow rate of HCl in the second selective LPCVD process is substantially lower than used in conventional methods, the growth of first SiGe layer 406 has a high growth rate. However, at the same time, polycrystalline SiGe may be formed on partly or wholly exposed polysilicon, such as a polysilicon gate of an MOS transistor exposed during the initial step of removing native oxide from substrate 400, and the mushroom phenomenon results.

Figure 4D:
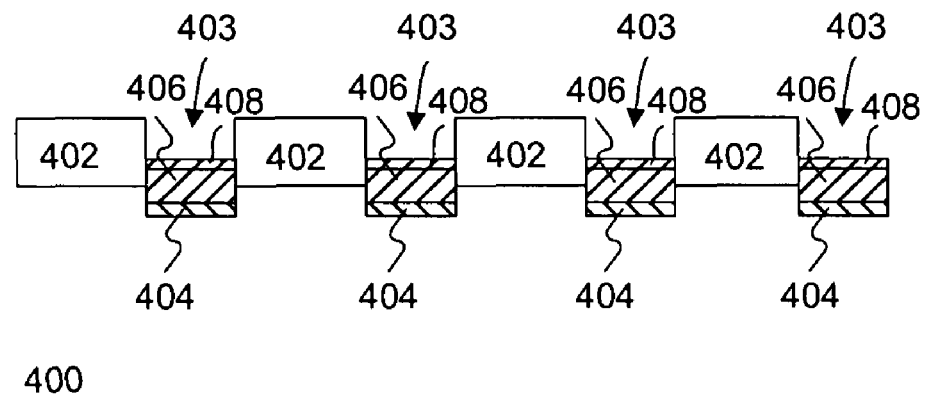

In FIG. 4D, a third selective LPCVD process is performed, using a third source gas including DCS, GeH$_4$, and HCl diluted in H$_2$. In the third source gas, a flow rate of DCS is approximately 40-100 sccms, a flow rate of GeH$_4$ is approximately 80-200 sccms, a flow rate of HCl is approximately 40-120 sccms, and a flow rate of H$_2$ is in the order of several to tens of slms. Because the flow rate of HCl in the third source gas is high, any residual polycrystalline SiGe from the second LPCVD process may be removed by the third selective LPCVD process.

Depending on the flow rate of HCl in the third source gas, a second SiGe layer 408 may or may not be formed on first SiGe layer 406. If the flow rate of HCl is such that a growth rate of SiGe is higher than an etching rate of SiGe, second SiGe layer 408 is formed. If the flow rate of HCl is such that a growth rate of SiGe is substantially the same an etching rate of SiGe, second SiGe layer 408 is not formed. If the flow rate of HCl is such that a growth rate of SiGe is lower than an etching rate of SiGe, not only is second SiGe layer 408 not formed, but first SiGe layer 406 is also partially etched. If second SiGe layer 408 is formed, impurity gases may also be included in the third source gas to dope second SiGe layer 408. For example, if second SiGe layer 408 is to be formed as p-type, B$_2$H$_6$ may be included in the third source gas.

Consistent with the second embodiment of the present invention, Si layer 404 acting as a seeding layer is formed before SiGe layers 406 and 408 are formed. Consequently, the pattern dependence problem associated with the conventional processing methods is avoided.

Also, the method consistent with the second embodiment of the present invention forms two layers of SiGe with different flow rates of HCl. The flow rate of HCl In the second LPCVD process is substantially lower than that in the third LPCVD process. Consequently, polycrystalline SiGe may be formed on partly or wholly exposed polysilicon, but will be effectively removed in the third LPCVD process due to the high flow rate of HCl.

As discussed above, consistent with the second embodiment of the present invention, a high-quality SiGe layer is formed without the mushroom problem. FIGS. 5A-5D show a specific example, in which the method consistent with the second embodiment is practiced to form an MOS transistor 500.

Figure 5A:
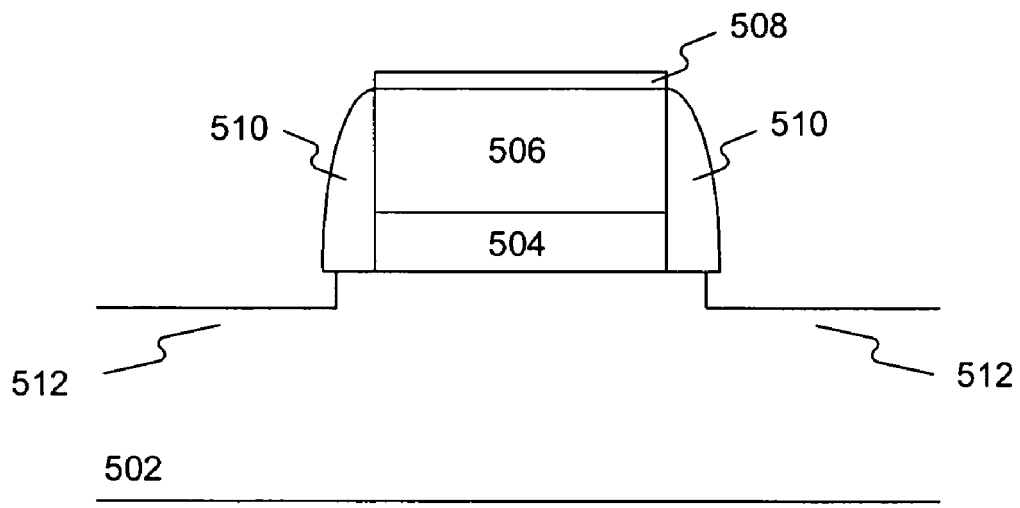
FIGS. 5A-5D illustrate a specific example of the method consistent with the second embodiment of the present invention.

In FIG. 5A, a Si substrate 502 is provided. A layer of gate dielectric 504 is formed on Si substrate 502. Gate dielectric 504 may comprise silicon dioxide or a high-K (dielectric constant) material. A layer of polysilicon gate electrode 506 is formed on gate dielectric 504. A cap layer 508 is formed on gate electrode 506. Cap layer 508 may comprise silicon dioxide or silicon nitride. Sidewall spacers 510 are formed on sidewalls of gate dielectric 504 and gate electrode 506. Diffusion regions are formed on both sides of gate dielectric 504, gate electrode 506, and are recess etched by, e.g., a wet etching process, to form recessed source and drain regions 512. In one aspect, the recess etching undercuts sidewall spacers 510 (as shown in FIG. 5A). In another aspect, the recess etching does not undercut sidewall spacers 510 (not shown).

Figure 5B:
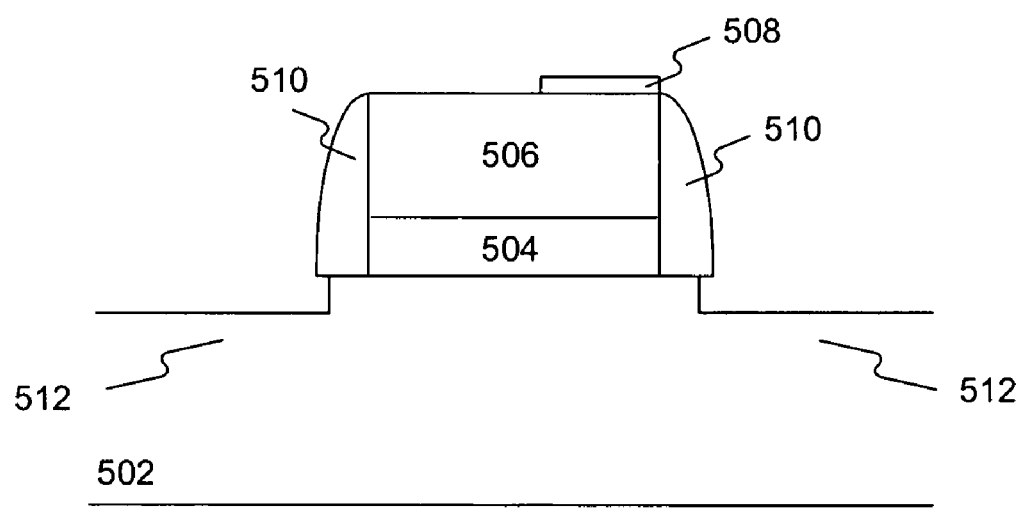

In FIG. 5B, a cleaning process is performed to prepare the structure of FIG. 5A for the first and second LPCVD processes of the method consistent with the second embodiment. The cleaning process may be performed using diluted hydrofluoric acid to remove native oxide on exposed portions of Si substrate 502, such as source and drain regions 512. In addition, cap layer 508 may be partly removed (as shown in FIG. 5B) or completely removed (not shown) by accident or by necessity, exposing a portion or an entirety of a top surface of gate electrode 506.

Figure 5C:
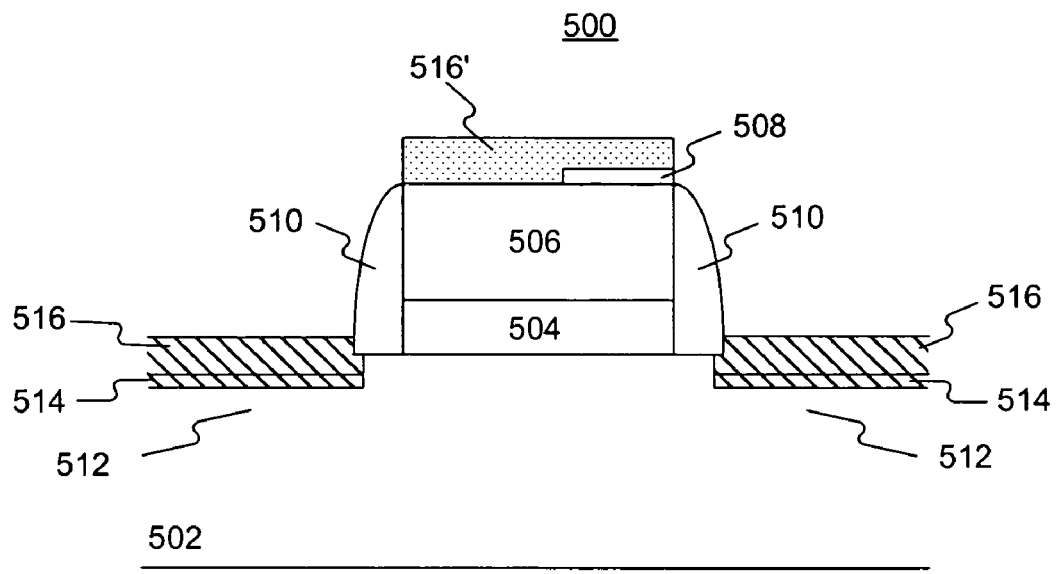

In FIG. 5C, Si substrate 502 having the features shown in FIG. 5B formed thereon is sent to a CVD machine (not shown) and another cleaning step is performed by baking Si substrate 502 in an H$_2$ environment. The first selective LPCVD process of the method consistent with the second embodiment is performed to form a seeding layer of Si 514 on the exposed portions of Si substrate 502. Then the second selective LPCVD process of the method consistent with the second embodiment is performed to form first single crystal SiGe layer 516 on Si layer 514. Because HCl in the second source gas has a low flow rate, a growth rate of first single crystal SiGe layer 516 is high. However, also because of the low flow rate of HCl, polycrystalline SiGe 516' is formed on exposed portions of gate electrode 506 and may expand laterally onto neighboring features thereof, e.g., cap layer 508, to form a mushroom shape.

Figure 5D:
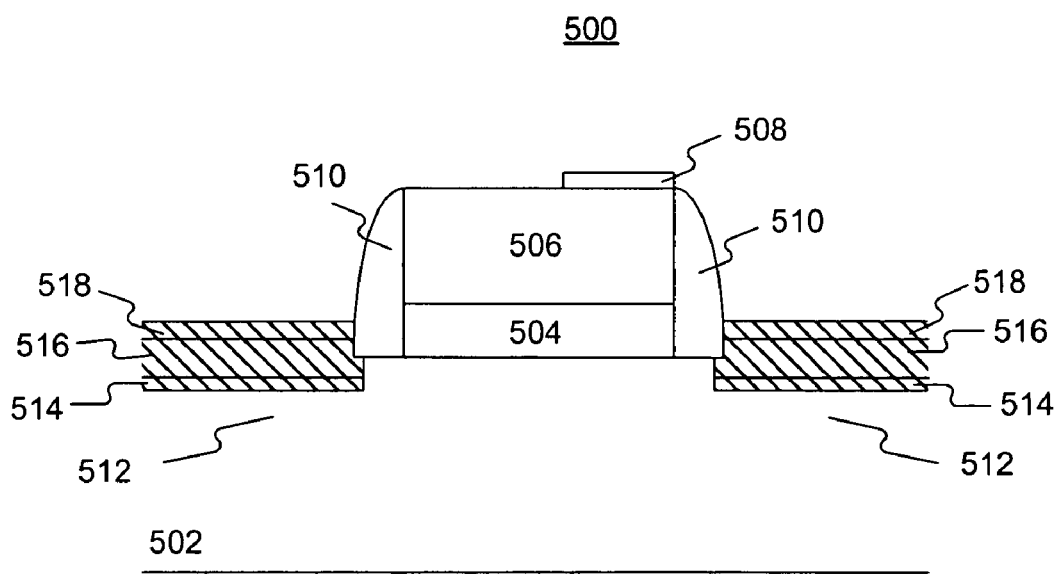

In FIG. 5D, the third selective LPCVD process of the method consistent with the second embodiment is performed to form a second layer of SiGe 518 on first SiGe layer 516. Because HCl in the third source gas has a high flow rate, an etching rate of polycrystalline SiGe is high. As a result, polycrystalline SiGe 516' formed on the exposed portion of gate electrode 506 and the neighboring features thereof is substantially or completely removed. In one aspect, the flow rate of HCl in the third source gas may be so high that an etching rate of SiGe is higher than a growth rate of SiGe in the third selective LPCVB process, as a result of which not only is polycrystalline SiGe 516' on the exposed portion of gate electrode 506 and the neighboring features thereof substantially or completely removed, but second single crystal SiGe layer 518 is not formed and first single crystal SiGe layer 516 on source and drain regions 512 is also partially etched.

As illustrated in FIGS. 5A-5D, the method consistent with the second embodiment of the present invention not only forms high quality single crystal SiGe epitaxial layers, but also removes polycrystalline residue, thereby preventing the mushroom problem.

FIGS. 5A-5D only illustrate a specific example of the method consistent with the second embodiment of the present invention. It is to be understood that the method consistent with the second embodiment of the present invention may be applied to any situations where a polycrystalline residue or the mushroom problem may occur.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device, comprising:

providing a substrate comprising silicon;

forming a plurality of patterns on the substrate;

forming a plurality of recesses in the substrate between the plurality of patterns;

cleaning the substrate;

selectively depositing a seeding layer of silicon over portions of the substrate exposed in the plurality of recesses; and selectively depositing a layer of silicon germanium over the seeding layer of silicon, wherein selectively depositing the seeding layer of silicon comprises depositing the seeding layer of silicon to a thickness of about 10-70 Å, and wherein an upper surface of the layer of silicon germanium is higher than a lower surface of the plurality of patterns.

2. The method of claim 1, wherein cleaning the substrate comprises baking the substrate in a hydrogen environment, wherein a flow rate of $H_2$ in the hydrogen environment is on the order of tens of sccms, and a temperature in the hydrogen environment is between 600° C. and 1100° C.

3. The method of claim 2, wherein baking the substrate, depositing the seeding layer of silicon, and selectively depositing the layer of silicon germanium are performed in situ.

4. The method of claim 1, wherein selectively depositing the seeding layer of silicon comprises performing a low-pressure chemical vapor deposition using a source gas including dichlorosilane (DCS) and hydrogen ($H_2$).

5. The method of claim 4, wherein a flow rate of DCS in the source gas is approximately 50-200 sccms (standard cubic centimeter per minute), and a flow rate of $H_2$ in the source gas is on the order of several to tens of slms (standard liters per minute).

6. The method of claim 1, wherein selectively depositing the layer of silicon germanium comprises performing a low-pressure chemical vapor deposition using a source gas including dichlorosilane (DCS), germane ($GeH_4$), hydrochloride (HCl), and hydrogen ($H_2$).

7. The method of claim 6, wherein a flow rate of DCS in the source gas is approximately 40-100 sccms (standard cubic centimeter per minute), a flow rate of $GeH_4$ in the source gas is approximately 80-200 sccms, a flow rate of HCl in the source gas is approximately 20-60 scorns, and a flow rate of $H_2$ in the source gas is on the order of several to tens of slms (standard liters per minute).

8. The method of claim 6, wherein the source gas further includes one or more impurity gases.

9. A method for manufacturing a semiconductor device, comprising:
providing a substrate comprising silicon;
cleaning the substrate;
performing a first low pressure chemical vapor deposition (LPCVD) process using a first source gas to selectively deposit a seeding layer of silicon (Si) over the substrate;
performing a second LPCVD process using a second source gas to selectively deposit a first layer of silicon germanium (SiGe) over the layer of Si, the second source gas including hydrochloride (HCl) at a first flow rate; and
performing a third LPCVD process using a third source gas including HCl at a second flow rate,
wherein the first flow rate is substantially lower than the second flow rate, and
wherein performing the second LPCVD process further comprises forming a mushroom-shaped polycrystalline SiGe, and performing the third LPCVD process comprises removing the polycrystalline SiGe and selectively depositing a second layer of SiGe over the first layer of SiGe.

10. The method of claim 9, wherein cleaning the substrate comprises baking the substrate in a hydrogen environment, wherein a flow rate of $H_2$ in the hydrogen environment is on the order of tens of sccms, and a temperature in the hydrogen environment is between 600° C. and 1100° C.

11. The method of claim 10, wherein baking the substrate, performing the first LPCVD process, performing the second LPCVD process, and performing the third LPCVD process are performed in situ.

12. The method of claim 9, further comprising:
forming a plurality of patterns on the substrate; and
forming a plurality of recesses in the substrate between the plurality of patterns,
wherein performing the first LPCVD process comprises performing the first LPCVD process to form the layer of Si over portions of the substrate exposed in the plurality of recesses.

13. The method of claim 9, wherein the first source gas includes dichlorosilane (DCS) and hydrogen ($H_2$).

14. The method of claim 13, wherein a flow rate of DCS in the first source gas is approximately 50-200 sccms (standard cubic centimeter per minute), and a flow rate of $H_2$ in the first source gas is on the order of several to tens of slms (standard liters per minute).

15. The method of claim 9, wherein performing the first LPCVD process comprises performing the first LPCVD process to deposit the layer of Si to a thickness of about 10-70 Å.

16. The method of claim 9, wherein the second source gas further includes dichiorosilane (DCS), germane ($GeH_4$), and hydrogen ($H_2$).

17. The method of claim 16, wherein a flow rate of DCS in the second source gas is approximately 40-100 sccms (standard cubic centimeter per minute), a flow rate of $GeH_4$ in the second source gas is approximately 80-200 sccms, a flow rate of HCl in the second source gas is approximately 20-60 sccms, and a flow rate of $H_2$ in the second source gas is on the order of several to tens of slms (standard liters per minute).

18. The method of claim 9, wherein the third source gas further includes dichiorosilane (DCS), germane ($GeH_4$), and hydrogen ($H_2$).

19. The method of claim 18, wherein a flow rate of DCS in the third source gas is approximately 40-100 sccms (standard cubic centimeter per minute), a flow rate of $GeH_4$ in the third source gas is approximately 80-200 sccms, a flow rate of HCl in the third source gas is approximately 40-120 sccms, and a flow rate of $H_2$ in the third source gas is on the order of several to tens of sims (standard liters per minute).

20. The method of claim 9, wherein the second source gas and the third source gas each further include one or more impurity gases.

21. A method for manufacturing a semiconductor device, comprising:
providing a substrate comprising silicon;
cleaning the substrate;
performing a first low pressure chemical vapor deposition (LPCVD) process using a first source gas to selectively deposit a seeding layer of silicon (Si) over the substrate;
performing a second LPCVD process using a second source gas to selectively deposit a first layer of silicon germanium (SiGe) over the layer of Si, the second source gas including hydrochloride (HCl) at a first flow rate; and
performing a third LPCVD process using a third source gas including HCl at a second flow rate,
wherein the first flow rate is substantially lower than the second flow rate, and
wherein performing the second LPCVD process further comprises forming a mushroom-shaped polycrystalline SiGe, and performing the third LPCVD process comprises removing the polycrystalline SiGe and partially etching the first layer of SiGe.

* * * * *